United States Patent
Ozaki (10) Patent No.: US 10,180,361 B2
(45) Date of Patent: Jan. 15, 2019

(54) TEMPERATURE ESTIMATION DEVICE AND TEMPERATURE ESTIMATION METHOD FOR CONTACTLESS POWER-RECEPTION DEVICE

(71) Applicant: NISSAN MOTOR CO., LTD., Yokohama-shi, Kanagawa (JP)

(72) Inventor: Michio Ozaki, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 15/564,283

(22) PCT Filed: Apr. 7, 2015

(86) PCT No.: PCT/JP2015/060814
§ 371 (c)(1),
(2) Date: Oct. 4, 2017

(87) PCT Pub. No.: WO2016/162940
PCT Pub. Date: Oct. 13, 2016

(65) Prior Publication Data
US 2018/0136048 A1 May 17, 2018

(51) Int. Cl.
*G01K 13/00* (2006.01)
*G01K 1/00* (2006.01)
(Continued)

(52) U.S. Cl.
CPC .............. *G01K 3/10* (2013.01); *B60L 3/00* (2013.01); *B60L 11/16* (2013.01); *B60L 11/18* (2013.01);
(Continued)

(58) Field of Classification Search
USPC .................................................. 374/152, 141
See application file for complete search history.

(56) References Cited

U.S. PATENT DOCUMENTS 5,645,352 A * 7/1997 Menten ................. G01K 15/00
361/161
7,071,649 B2 * 7/2006 Shafer .................. B62D 5/0496
318/708
(Continued)

FOREIGN PATENT DOCUMENTS

| JP | 7-334263 A | 12/1995 |
|---|---|---|
| JP | 2013-135572 A | 7/2013 |
| JP | 2013-192411 A | 9/2013 |
| WO | WO-2015/045246 A1 | 4/2015 |

*Primary Examiner* — Mirellys Jagan
(74) *Attorney, Agent, or Firm* — Foley & Lardner LLP (57) ABSTRACT

A charging controller (25) acquires the power loss of a power transmission coil (31) from a power supply device (100) via wireless communication. A temperature estimation unit (33) estimates the ambient temperature of a power reception coil on the basis of a preset amount of heat generation of a power reception device (200) and the power loss of the power transmission coil (31). In this case, when the positional relationship between the power transmission coil (31) and the power reception coil (41) is shifted from a normal positional relationship, the temperature estimation unit (33) increases, in accordance with the magnitude of positional shift amount, the contribution to a temperature rise due to the power loss of the power transmission coil (31). Accordingly, an abnormal increase in the ambient temperature of the power reception coil (41) can be prevented.

4 Claims, 10 Drawing Sheets

(51) Int. Cl.
- *G01K 3/10* (2006.01)
- *H01F 38/14* (2006.01)
- *H02J 7/00* (2006.01)
- *H02J 50/90* (2016.01)
- *B60L 3/00* (2006.01)
- *B60L 11/16* (2006.01)
- *B60L 11/18* (2006.01)
- *H02J 50/10* (2016.01)
- *G01K 1/14* (2006.01)
- *G01K 3/00* (2006.01)
- *G01R 21/00* (2006.01)
- *H02J 7/02* (2016.01)
- *H02J 50/12* (2016.01)
- *H02J 50/80* (2016.01)

(52) U.S. Cl.
CPC ............. *B60L 11/182* (2013.01); *G01K 1/14* (2013.01); *G01K 3/005* (2013.01); *G01R 21/00* (2013.01); *H01F 38/14* (2013.01); *H02J 7/0029* (2013.01); *H02J 7/025* (2013.01); *H02J 50/10* (2016.02); *H02J 50/12* (2016.02); *H02J 50/80* (2016.02); *H02J 50/90* (2016.02)

(56) References Cited

U.S. PATENT DOCUMENTS

| | | | |
|---|---|---|---|
| 2002/0006154 A1* | 1/2002 | Nada | B60K 6/445 374/169 |
| 2007/0070560 A1* | 3/2007 | Hikawa | G01K 7/00 361/29 |
| 2007/0160221 A1* | 7/2007 | Pfaffinger | H04R 29/001 381/59 |
| 2013/0181724 A1* | 7/2013 | Teggatz | G01N 27/02 324/629 |
| 2013/0241476 A1* | 9/2013 | Okada | G01N 21/94 320/108 |
| 2014/0084856 A1* | 3/2014 | Howard | H02J 7/007 320/108 |
| 2014/0159501 A1* | 6/2014 | Kanno | H02J 17/00 307/104 |
| 2014/0371944 A1* | 12/2014 | Vadakkanmaruveedu | G01K 7/16 700/299 |
| 2014/0376592 A1* | 12/2014 | Hollunder | G01K 7/42 374/152 |
| 2015/0377715 A1* | 12/2015 | Poret | G01K 7/183 336/55 |
| 2016/0076945 A1* | 3/2016 | Wen | G01K 7/34 374/184 |

* cited by examiner

TEMPERATURE ESTIMATION DEVICE AND TEMPERATURE ESTIMATION METHOD FOR CONTACTLESS POWER-RECEPTION DEVICE

TECHNICAL FIELD

The present invention relates to a temperature estimation device and a temperature estimation method for a contactless power reception device which estimate the temperature of the power reception device that contactlessly receives the power transmitted from a power transmission coil.

BACKGROUND ART

There has been proposed a contactless power supply system that contactlessly supplies power to charge a battery mounted on an electric vehicle. In the contactless power supply system, power is transmitted via a power transmission coil from a power transmission device provided on the ground side and the transmitted power is received by a power reception coil of a power reception device mounted on the vehicle. Then, the received power is supplied to loads, such as a battery and a motor.

In such a contactless power supply system, when a change in the gap between the power transmission coil and the power reception coil or a planar positional shift between the power transmission coil and the power reception coil occurs, the power loss of the power transmission coil increases and the temperature of the power reception device rises due to an increase of this power loss. Therefore, the temperature of the power reception device needs to be monitored.

Patent Literature 1 discloses a temperature control device that estimates the temperature of an electronic device by calculation. In this Patent Literature 1, the temperature is estimated by integrating the quantity of heat on the basis of operation mode information and an operation time. Then, when the estimated temperature reaches a threshold, the operation mode is switched to an operation mode which generates a less amount of heat. However, in Patent Literature 1, the temperature is estimated by detecting the operation mode inside the device, and the influence from an external device is not taken into consideration.

CITATION LIST

Patent Literature

Patent Literature 1: Japanese Patent Laid-Open Publication No. 7-334263

SUMMARY OF INVENTION

As described above, in order to prevent an increase in temperature of a contactless power reception device, the temperature of this contactless power reception device needs to be monitored. However, if a temperature sensor is installed, there arise problems that the device increases in scale and the cost increases, and therefore there increases a demand for estimating the temperature without installing a device, such as a temperature sensor.

The present invention has been made in order to solve the conventional problems, and has an object to provide a temperature estimation device and temperature estimation method for a contactless power reception device capable of accurately estimating the ambient temperature of a power reception coil.

A temperature estimation device for a contactless power reception device according to an aspect of the present invention includes: a power transmission-side power loss acquisition unit which acquires the power loss of a power transmission coil; and a temperature estimation unit which estimates the ambient temperature of a power reception coil on the basis of a preset amount of heat generation of a power reception device and the power loss of the power transmission coil. When the positional relationship between the power transmission coil and the power reception coil is shifted from a normal positional relationship, the temperature estimation unit increases, in accordance with a magnitude of a positional shift amount, a contribution to a temperature rise due to the power loss of the power transmission coil.

A temperature estimation method for a contactless power reception device according to an aspect of the present invention includes the steps of: acquiring a power loss of a power transmission coil; and estimating the ambient temperature of a power reception coil based on a preset amount of heat generation of a power reception device and the power loss of the power transmission coil. The temperature estimation method increases a contribution to a temperature rise due to the power loss of the power transmission coil, in accordance with a magnitude of a positional shift amount, when estimating the ambient temperature of the power reception coil, in a case where the positional relationship between the power transmission coil and the power reception coil is shifted from a normal positional relationship.

DESCRIPTION OF EMBODIMENTS

Figure 1:
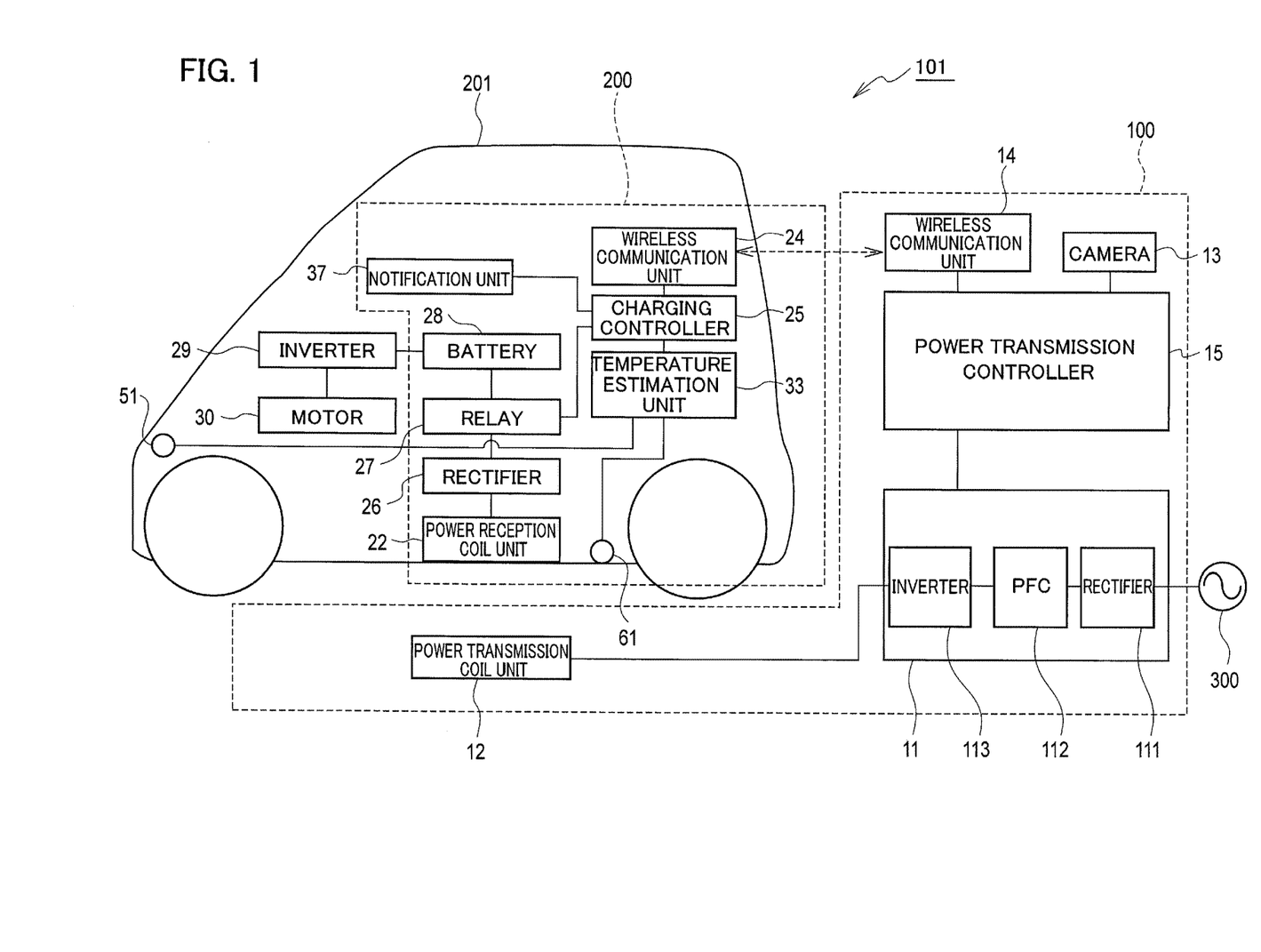
FIG. 1 is a block diagram illustrating a configuration of a contactless power supply system including a contactless power reception device to which a temperature estimation device according to an embodiment of the present invention is applied.

Hereinafter, an embodiment of the present invention will be described with reference to the drawings. FIG. 1 is a block diagram illustrating a configuration of a contactless power supply system according to the embodiment of the present invention. As illustrated in FIG. 1, a contactless power supply system 101 according to the present embodiment includes: a power supply device 100 which is provided on the ground side and transmits power; and a power reception device 200 (contactless power reception device) which is mounted on a vehicle 201, receives the power transmitted from the power supply device 100, and charges a battery 28.

The power supply device 100 is installed on a charging stand or the like provided with a parking space for the vehicle 201, and contactlessly transmits power to the vehicle 201. This power supply device 100 is mainly constituted by a power controller 11, a power transmission coil unit 12, a wireless communication unit 14, and a power transmission controller 15. Furthermore, this power supply device 100 includes a camera 13 which images, from the above of the parking space, the vehicle 201 parked in this parking space.

The power controller 11 has a function to convert an alternating current (AC) power output from an AC power supply 300 (e.g., 50 Hz, 200 V) to a high frequency AC power and transmit the power to the power transmission coil unit 12. This power controller 11 includes a rectifier 111, a PFC (Power Factor Correction) circuit 112, and an inverter 113.

The rectifier 111 converts the AC power output from the AC power supply 300 to a direct current (DC) power. The PFC circuit 112 includes, for example, a step-up chopper circuit etc. and is a circuit for improving the power factor by shaping the waveform of an output current from the rectifier 111. The output of the PFC circuit 112 is smoothed by a smoothing capacitor.

The inverter 113 includes a plurality of switching elements (e.g., insulating gate bipolar transistor (IGBT)), and converts a DC power to an AC power of a desired frequency by controlling the ON/OFF of each switching element.

Figure 2:
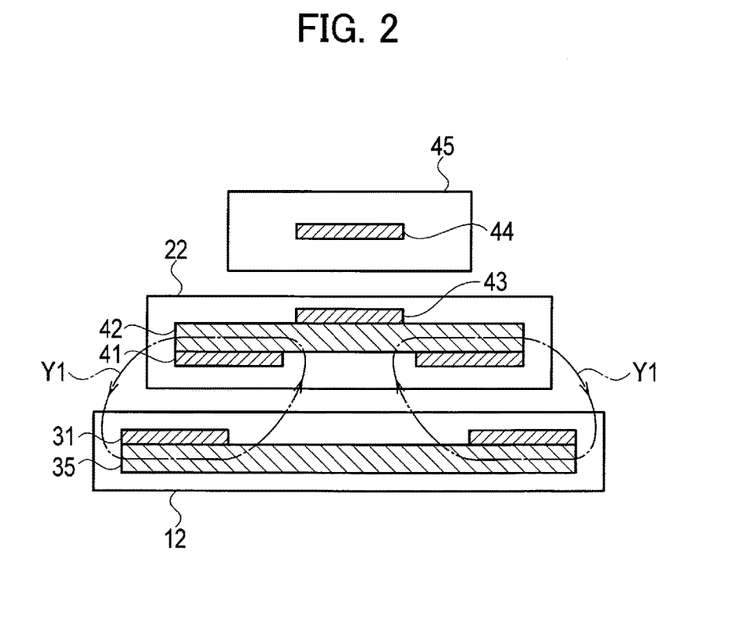
FIG. 2 is an explanatory view illustrating a magnetic flux generated between a power transmission coil unit and a power reception coil unit according to an embodiment of the present invention.

The power transmission coil unit 12 is provided at a position which faces, when the vehicle 201 stops at a desired position of the parking space, a power reception coil unit 22 provided in the power reception device 200. Then, the power transmission coil unit 12 contactlessly transmits power to the power reception coil unit 22. This power transmission coil unit 12 includes a power transmission coil 31 and a ferrite plate 35 formed of a material with high magnetic permeability and having a planar shape, as illustrated in FIG. 2.

The wireless communication unit 14 performs two-way communication with a wireless communication unit 24 provided in the power reception device 200. By this communication, as described later, transmitted are various data, such as an output voltage Vinv and output current Iinv of the inverter 113 detected by the power supply device 100, and a power loss WGC in the power transmission coil unit 12, and a coupling coefficient κ described later, to the power reception device 200.

The power transmission controller 15 generally controls the whole power supply device 100. This power transmission controller 15 can be configured using a microcomputer mainly including, for example, a central processing unit (CPU), a read-only memory (ROM), a random-access memory (RAM), and an input/output (I/O) interface. In particular, this power transmission controller 15 controls the power controller 11, the wireless communication unit 14, and the camera 13.

On the other hand, the power reception device 200 mounted on the vehicle 201 includes the power reception coil unit 22, the wireless communication unit 24, a charging controller 25, a rectifier 26, a relay 27, and a temperature estimation unit 33. Furthermore, the power reception device 200 includes the battery 28 which stores power and supplies a DC power to an inverter 29, and a notification unit 37 which notifies an occupant of the vehicle 201 of various information. The inverter 29 converts a DC power to an AC power, and supplies the converted AC power to a motor 30.

Moreover, at a front end part of the vehicle 201, there is provided a forward-distance sensor 51 for measuring the distance from this front end part to a wall surface 52 (see FIG. 7) provided in the parking space. Furthermore, at a bottom part of the vehicle 201, there is provided a gap sensor 61 for measuring the distance from this bottom part to the power transmission coil unit 12. As the forward-distance sensor 51 and the gap sensor 61, an ultrasonic sensor can be used, for example.

The power reception coil unit 22 is a coil for contactlessly receiving the power transmitted from the power transmission coil unit 12. This power reception coil unit 22 includes the power transmission coil 31 and the ferrite plate 35 formed of a material with high magnetic permeability and having a planar shape, as illustrated in FIG. 2.

The wireless communication unit 24 performs two-way communication with the wireless communication units 14 provided in the power supply device 100. The rectifier 26 is connected to the power reception coil unit 22, converts an AC power output from this power reception coil unit 22 to a DC power and outputs the DC power. This rectifier 26 is mounted on a circuit board 44 inside an electric box 45 provided in a vicinity of the bottom face of the vehicle 201, as illustrated in FIG. 2.

The relay 27 includes a relay switch whose ON/OFF states are switched under the control of the charging controller 25. The relay 27 is capable of separating a circuit including the battery 28 from a circuit including the power reception coil unit 22 and the rectifier 26 by turning off the relay switch.

On the basis of a power loss WJB of the circuit board 44 mounted inside the electric box 45 (see FIG. 2) having the rectifier 26 mounted therein, a power loss WVC in the power reception coil unit 22, and a power loss WGC in the power transmission coil unit 12, the temperature estimation unit 33 estimates the ambient temperature (ambient temperature of the power reception coil) of the power reception coil unit 22, such as a ferrite plate 42, a copper wire of the coil, and other circuit elements, using an approach described later. The details will be described later. Here, the amount of heat generation caused by the power loss WJB of the circuit board 44 and the power loss WVC in the power reception coil unit 22 is the amount of heat generation of the power reception device.

The notification unit 37 includes a display unit, such as a display, and notifies an occupant of the vehicle 201 of various information including the information about contactless power supply. In particular, as described later, when the ambient temperature of the power reception coil unit 22 is estimated to exceed a threshold temperature by the temperature estimation unit 33, this fact is displayed on the display. Moreover, when the ambient temperature is estimated to exceed a threshold temperature, and thereby the transmission power from the power supply device 100 is reduced (the details will be described later) and the time needed to charge the battery 28 is accordingly changed, this fact is displayed on the display to be notified to the occupant.

The charging controller 25 generally controls the power reception device 200. In particular, the charging controller 25 acquires the information about the output voltage Vinv and output current Iinv of the inverter 113 which is transmitted from the power supply device 100 via the wireless communication unit 24. Furthermore, the charging controller 25 acquires the information about the power loss WGC in the power transmission coil unit 12. That is, the charging controller 25 has a function as a power transmission-side power loss acquisition unit which acquires the information about the power loss of the power transmission coil unit 12.

Furthermore, the charging controller 25 has a function, as a positional shift amount acquisition unit, which acquires the amounts of planar positional shift Lx, Ly of the power reception coil unit 22 from the power transmission coil unit 12, and the gap on the basis of a distance to the wall surface 52 detected by the forward-distance sensor 51 and a distance to the power transmission coil unit 12 detected by the gap sensor 61. The charging controller 25 and the temperature estimation unit 33 can be configured using a microcomputer mainly including, for example, a central processing unit (CPU), a read-only memory (ROM), a random-access memory (RAM), and an input/output (I/O) interface.

Then, in the contactless power supply system 101 illustrated in FIG. 1, power is transmitted in a contactless state by electromagnetic induction between the power transmission coil unit 12 and the power reception coil unit 22. That is, if an electric current flows through the power transmission coil unit 12, magnetic coupling occurs between the power transmission coil unit 12 and the power reception coil unit 22, so that power can be contactlessly transmitted to the power reception coil unit 22 from the power transmission coil unit 12.

Furthermore, in the present embodiment, when the ambient temperature of the power reception coil unit 22 reaches a preset threshold temperature during transmission of power, the transmitted power is reduced to prevent the ambient temperature of the power reception coil unit 22 from abnormally rising.

Next, a factor causing an increase in temperature of the power reception coil unit 22 during transmission of power will be explained with reference to FIG. 2. FIG. 2 is an explanatory view illustrating a magnetic flux generated between the power transmission coil unit 12 and the power reception coil unit 22.

The factor causing an increase in ambient temperature of the power reception coil unit 22 illustrated in FIG. 2 includes the power loss WJB inside the electric box 45. As illustrated in FIG. 2, the circuit board 44 is arranged inside the electric box 45, and various electronic components including the rectifier 26 are mounted on this circuit board 44. Accordingly, this circuit board 44 generates heat due to the power loss WJB generated during operation, causing an increase in ambient temperature of the power reception coil unit 22.

Furthermore, the factor causing an increase in ambient temperature of the power reception coil unit 22 may include the power loss WVC of the power reception coil unit 22 and the power loss WGC of the power transmission coil unit 12. Accordingly, if an increase in temperature of the power reception coil unit 22 is designated by $\Delta T$, this increase in temperature $\Delta T$ can be expressed by Formula (1) below using correction coefficients A, B, and C.

$$\Delta T = A*WJB + B*WVC + C*WGC \tag{1}$$

Note that $\Delta T$ is an increase in temperature after a sufficient time has elapsed.

Then, the increase in temperature $\Delta T$ can be calculated from Formula (1), and furthermore the ambient temperature of the power reception coil unit 22 can be estimated on the basis of the ambient temperature detected by an ambient temperature sensor (not illustrated) provided in place in the power supply device 100 or the vehicle 201. Specifically, the ambient temperature of the power reception coil unit 22 can be obtained by adding the increase in temperature $\Delta T$ to the ambient temperature.

Moreover, in Formula (1), because each of the power losses WJB, WVC, and WGC is a copper loss and proportional to the square of an electric current, the ambient temperature of the power reception coil unit 22 can be calculated on the basis of an electric current flowing through the circuit board 44 inside the electric box 45, an electric current flowing through a circuit including a circuit board 43 of the power reception coil unit 22, and an electric current flowing through the power transmission coil unit 12. Furthermore, because the correction coefficients A and B are the numerical values specific to the power reception device 200, they are already known. Accordingly, if the correction coefficient C of the power loss WGC in the power transmission coil unit 12 can be obtained, the increase in temperature $\Delta T$ can be calculated from the above-described Formula (1). The correction coefficient C is a numerical value varying with the relative positional relationship between the power transmission coil unit 12 and the power reception coil unit 22, and the calculation method thereof will be described later.

Next, the principle that the power reception coil unit 22 generates heat in contactlessly transmitting power to the power reception coil unit 22 from the power transmission coil unit 12, and the relationship with the correction coefficient C will be explained. As illustrated in FIG. 2, the power transmission coil unit 12 is constituted by the ferrite plate 35 and the power transmission coil 31 wound around the upper face of this ferrite plate 35. Moreover, the power reception coil unit 22 includes the ferrite plate 42 and a power reception coil 41 wound around the lower face of this ferrite plate 42, and furthermore the circuit board 43 having various electronic components mounted thereon is provided on the upper face of the ferrite plate 42.

Then, when the vehicle 201 stops at a desired position in a parking space, the power reception coil unit 22 is installed at a position facing the power transmission coil unit 12. Accordingly, if in this state an electric current is supplied to the power transmission coil 31 for excitation, a magnetic flux is formed as indicated by an arrow Y1. Because this magnetic flux passes through the ferrite plate 42 of the power reception coil unit 22 and interlinks with the power reception coil 41, power will be transmitted to this power reception coil 41.

Moreover, the magnetic flux passing through the ferrite plate 42 varies with a relative positional relationship between the power transmission coil unit 12 and the power reception coil unit 22. That is, when the vehicle 201 is not stopped at a desired position inside the parking space, a planar positional shift occurs between the power transmission coil unit 12 and the power reception coil unit 22. Furthermore, the distance (gap G) between the power transmission coil unit 12 and the power reception coil unit 22 varies with the number of occupants riding on the vehicle 201 and the like. When such a positional shift occurs, the magnetic flux passing through the ferrite plate 42 varies to generate a high-density magnetic-flux part, and therefore magnetic saturation occurs to cause heat generation. That is, the amount of heat generation will vary with the relative positional relationship between the power transmission coil unit 12 and the power reception coil unit 22.

Hereinafter, how the magnetic flux passing through the ferrite plate 42 of the power reception coil unit 22 varies with the gap G between the power transmission coil unit 12 and the power reception coil unit 22 will be explained with reference to FIG. 3.

Figure 3:
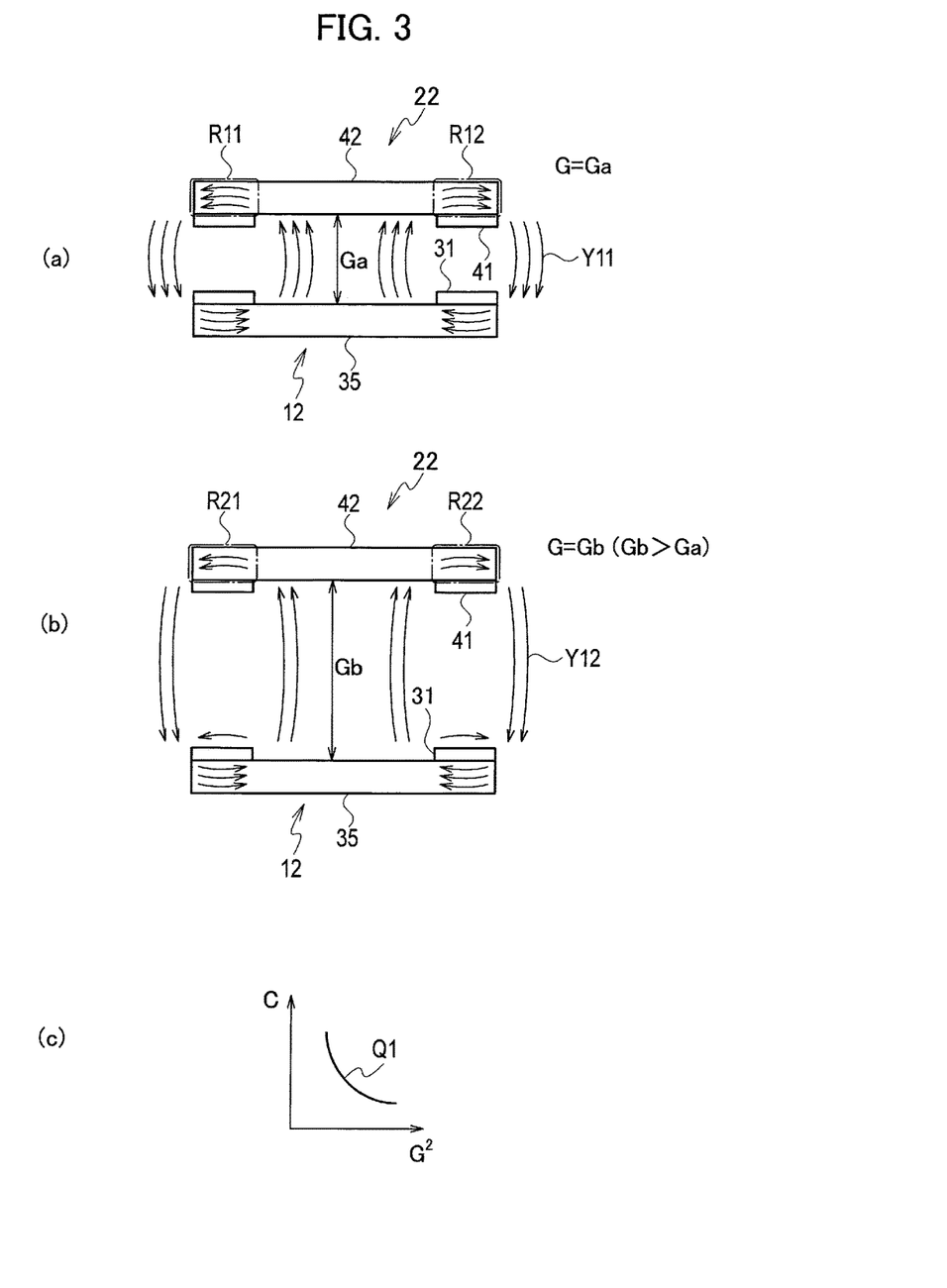
FIG. 3(a) is an explanatory view illustrating the magnetic flux when a gap between the power transmission coil unit and the power reception coil unit is Ga.
FIG. 3(b) is an explanatory view illustrating the magnetic flux when the gap is Gb.
FIG. 3(c) is a characteristic chart illustrating a relationship between the square of the gap and a correction coefficient C.

FIG. 3(*a*) illustrates the magnetic flux when the gap G which is the distance between the power transmission coil unit 12 and the power reception coil unit 22 is a reference value Ga, while FIG. 3(*b*) illustrates the magnetic flux when the gap G becomes Gb which is longer than the reference value Ga. As seen from FIGS. 3(*a*) and 3(*b*), when the gap G becomes longer, the magnetic flux which reaches the power reception coil unit 22 from the power transmission coil unit 12 decreases. That is, the magnetic flux indicated by an arrow Y12 decreases relative to the magnetic flux indicated by an arrow Y11. More specifically, the magnetic flux passing through areas R21 and R22 illustrated in FIG. 3(*b*) decreases relative to the magnetic flux passing through areas R11 and R12 illustrated in FIG. 3(*a*).

As the result, the magnetic flux passing through the ferrite plate 42 of the power reception coil unit 22 decreases, and the amount of heat generation of this ferrite plate 42 decreases. In this case, because the magnetic flux passing through the ferrite plate 42 decreases in inverse proportion to the square of the gap G, the amount of heat generation will decrease in inverse proportion to the square of the gap G. Accordingly, as illustrated in FIG. 3(*c*), the above-described correction coefficient C may be set so as to have a characteristic inversely proportional to the square of the gap G.

Figure 4:
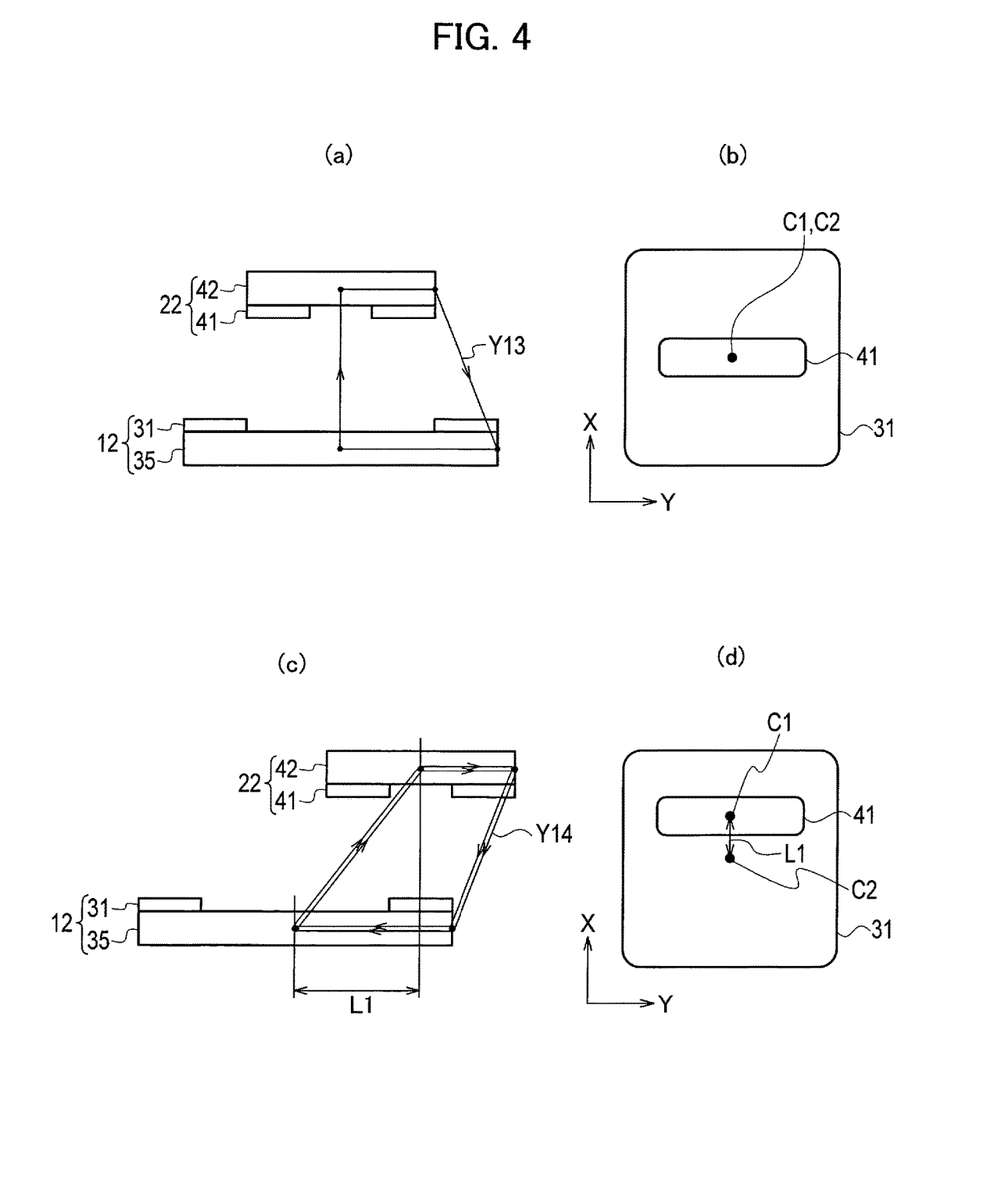
FIG. 4(a) is an explanatory view illustrating the magnetic flux when there is no positional shift in the short side direction between the power transmission coil unit and the power reception coil unit.
FIG. 4(b) is an explanatory view illustrating the positional relationship between the power transmission coil unit and the power reception coil unit in the case of FIG. 4(a)
FIG. 4(c) is an explanatory view illustrating the magnetic flux when there is a positional shift in the short side direction between the power transmission coil unit and the power reception coil unit.
FIG. 4(d) is an explanatory view illustrating the positional relationship between the power transmission coil unit and the power reception coil unit in the case of FIG. 4(c).

Next, a change in the amount of heat generation corresponding to the amount of planar positional shift of the power reception coil unit 22 from the power transmission coil unit 12 will be explained with reference to the explanatory views illustrated in FIG. 4 to FIG. 6. FIG. 4(*a*) is a cross sectional view in the X-axis direction when the power reception coil unit 22 is not positionally shifted from the power transmission coil unit 12, in which an arrow Y13 indicates the magnetic flux. Moreover, FIG. 4(*b*) schematically illustrates the plan view in this case. Note that, as illustrated in FIG. 4(*b*), the power reception coil 41 has a rectangular shape, in which the short side direction is set to the X-axis direction.

On the other hand, FIG. 4(*c*) is a cross sectional view in the X-axis direction when the power reception coil unit 22 is positionally shifted by a distance L1 in the X-axis direction, in which an arrow Y14 indicates the magnetic flux. Moreover, FIG. 4(*d*) schematically illustrates a plan view in this case.

As seen from comparison between FIG. 4(*a*) and FIG. 4(*c*), a positional shift in the X-axis direction occurring between the power transmission coil unit 12 and the power reception coil unit 22 reduces a coupling coefficient (designated by "κ") between the both coils. Accordingly, the power transmission controller 15 of the power supply device 100 increases the power supplied to the power transmission coil unit 12 so that a desired power is generated in the power reception coil unit 22. As the result, the magnetic flux output from the power transmission coil 31 increases as illustrated in FIG. 4(*c*), and the magnetic flux passing through the ferrite plate 42 also increases accordingly. Therefore, the concentration of the magnetic flux occurs in the ferrite plate 42, causing an increase of the ambient temperature of the power reception coil unit 22. Moreover, the ambient temperature of the power reception coil unit 22 will increase linearly with respect to the amount of positional shift in the X-axis direction.

Next, a positional shift in the Y-axis direction (direction perpendicular to the X-axis) will be explained. FIG. 5(*a*) is a cross sectional view in the Y-axis direction when the power reception coil unit 22 is not positionally shifted from the power transmission coil unit 12, in which an arrow Y15 indicates a magnetic flux. Moreover, FIG. 5(*b*) schematically illustrates the plan view in this case. Note that, as illustrated in FIG. 5(*b*), the power reception coil 41 has a rectangular shape, in which the long side direction is set to the Y-axis direction.

Figure 5:
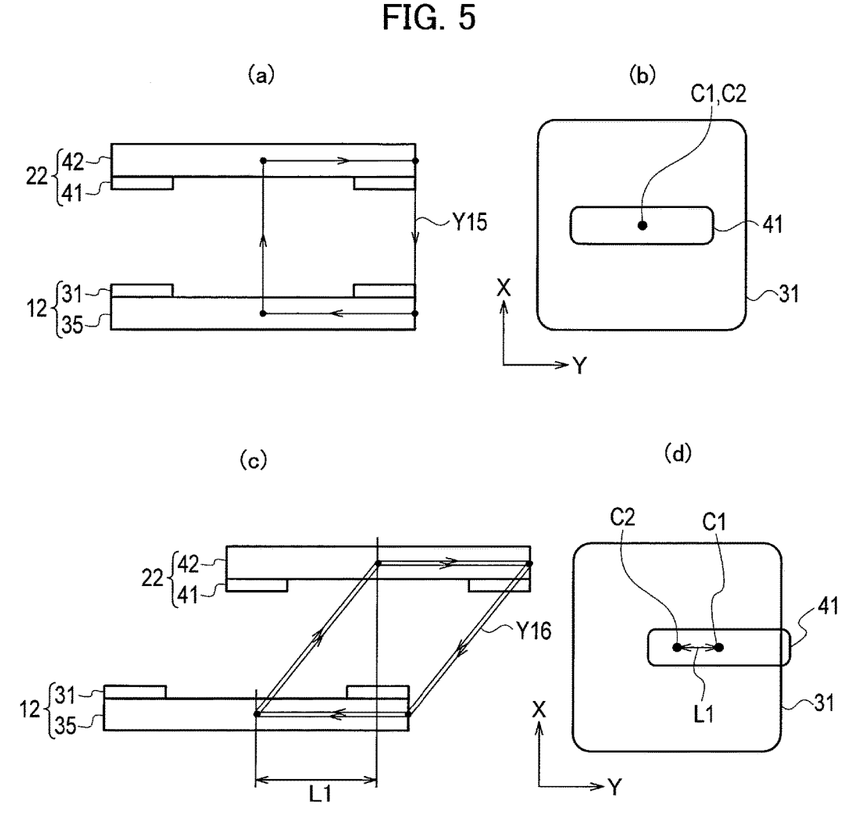
FIG. 5(a) is an explanatory view illustrating the magnetic flux when there is no positional shift in the long side direction between the power transmission coil unit and the power reception coil unit.
FIG. 5(b) is an explanatory view illustrating the positional relationship between the power transmission coil unit and the power reception coil unit in the case of FIG. 5(a)
FIG. 5(c) is an explanatory view illustrating the magnetic flux when there is a positional shift in the long side direction between the power transmission coil unit and the power reception coil unit.
FIG. 5(d) is an explanatory view illustrating the positional relationship between the power transmission coil unit and the power reception coil unit in the case of FIG. 4(c).
Figure 6:
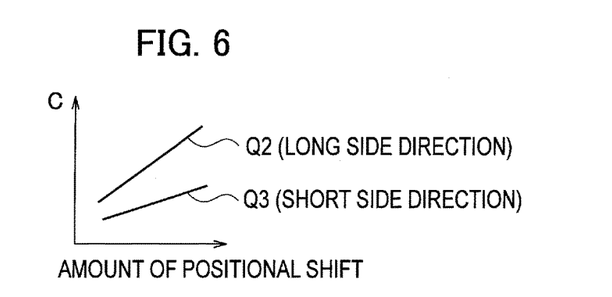
FIG. 6 is a characteristic chart illustrating a relationship between the amounts of positional shift in the short side direction and long side direction and the correction coefficient C.

On the other hand, FIG. 5(*c*) is a cross sectional view in the Y-axis direction when the power reception coil unit 22 is positionally shifted by the distance L1 in the Y-axis direction, in which an arrow Y16 indicates a magnetic flux. Moreover, FIG. 5(*d*) schematically illustrates a plan view in this case.

As seen from the comparison between FIG. 5(*a*) and FIG. 5(*c*), a positional shift in the Y-axis direction occurring between the power transmission coil unit 12 and the power reception coil unit 22 reduces the coupling coefficient κ between the both coils. Accordingly, the power transmission controller 15 of the power supply device 100 increases the power supplied to the power transmission coil unit 12 so that a desired power is generated in the power reception coil unit 22. As the result, the magnetic flux output from the power transmission coil 31 increases as illustrated in FIG. 5(*c*), and the magnetic flux passing through the ferrite plate 42 also increases accordingly. Therefore, the concentration of the magnetic flux occurs in the ferrite plate 42, causing an increase of the ambient temperature of the power reception coil unit 22. Moreover, the ambient temperature of the power reception coil unit 22 will increase linearly with respect to the amount of positional shift in the Y-axis direction.

Moreover, the positional shift in the Y-axis direction affects the increase in temperature more than the above-described positional shift in the X-axis direction. That is, when the amounts of positional shift in the both directions are the same, the positional shift in the Y-axis direction (long side direction) generates more heat than the positional shift in the X-axis direction (short side direction). Accordingly, as illustrated in FIG. 6, the correction coefficient C may be set so as to linearly vary with respect to the amount of positional shift in the X-axis direction (see a straight line Q3), and the correction coefficient C may be set so as to linearly vary with respect to the amount of positional shift in the Y-axis direction (long side direction) (see a straight line Q2). In this case, the correction coefficient C is set so that the straight line Q2 has a lager gradient than the straight line Q3.

Furthermore, in summary, it turns out that there are relationships (A) and (B) below between the correction coefficient C and the positional relationship between the coils.

(A) The correction coefficient C is inversely proportional to the square of the gap G between the power transmission coil unit 12 and the power reception coil unit 22.

(B) The correction coefficient C varies linearly with respect to the amount of positional shift (this is designated by "Lx") in the X-axis direction and to the amount of positional shift (this is designated by "Ly") in the Y-axis direction.

Accordingly, if the correction coefficient C is determined on the basis of the relationships (A) and (B), the amount of heat generation due to the power loss WGC of the power transmission side coil can be corrected. Specifically, the correction coefficient C can be obtained from Formula (2) below using coefficients a, b, and c.

$$C=(a*Lx+b*Ly+c)/G^2 \qquad (2)$$

Then, the temperature estimation unit 33 illustrated in FIG. 1 obtains the amounts of positional shift Lx, Ly and the gap G, to thereby calculate the correction coefficient C, substitutes this correction coefficient C into the above-described Formula (1), and multiplies this correction coefficient C by the power loss WGC of the power transmission coil 31, thereby obtaining the increase in temperature ΔT. That is, the contribution to an increase in temperature due to the power transmission coil 31 is changed using the correction coefficient C which varies with a magnitude of the positional shift amount. Then, the ambient temperature of the power reception coil unit 22 is estimated by adding the increase in temperature ΔT to the ambient temperature of the power reception coil unit 22, and the control is conducted, when this estimated temperature reaches a preset threshold temperature, so as to suppress the transmitted power and suppress a further increase in temperature.

Figure 7:
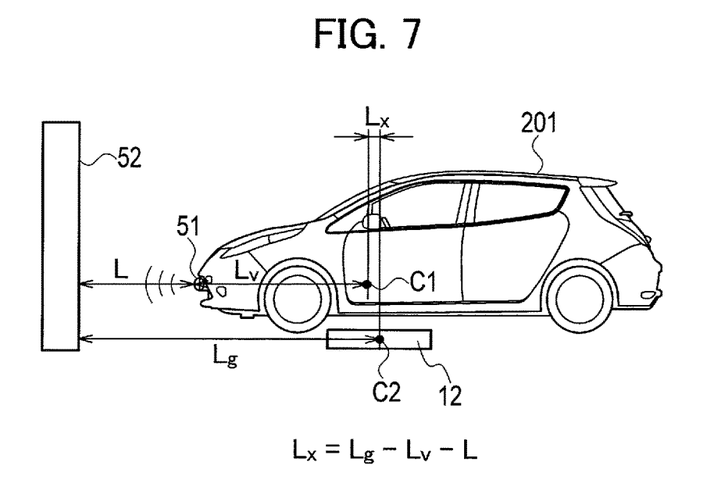
FIG. 7 is an explanatory view illustrating how the amount of positional shift in the X-axis direction (short side direction) is measured using a forward-distance sensor.

Next, a method for detecting the amounts of planar positional shift Lx, Ly will be explained with reference to FIG. 7 and FIG. 8. FIG. 7 is an explanatory view illustrating a first method for detecting the amount of positional shift Lx in the X-axis direction. As illustrated in FIG. 7, the forward-distance sensor 51 provided at a front end part of the vehicle 201 transmits an ultrasonic signal to measure the distance L to the wall surface 52 provided in place in the parking space. Then, on the basis of a distance Lg (known numerical value) from a center point C2 of the power transmission coil unit 12 to the wall surface 52, a distance Lv (known numerical value) from a center point C1 of the power reception coil unit 22 to the front end part, and the distance L (measured value), the distance between the respective center points C1 and C2, that is, the amount of positional shift Lx in the X-axis direction is calculated by Formula (3) below.

$$Lx=Lg-Lv-L \qquad (3)$$

In this manner, the amount of positional shift Lx in the X-axis direction can be obtained.

Figure 8:
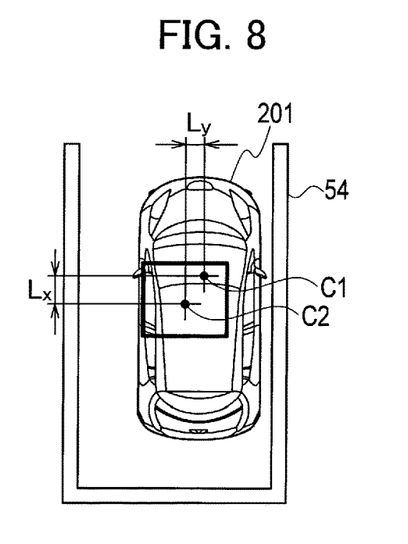
FIG. 8 is an explanatory view illustrating how the amounts of positional shift in the X-axis direction and Y-axis direction (long side direction) are measured from the bird's-eye view image of a vehicle.

FIG. 8 is an explanatory view illustrating a second method for detecting the amount of positional shift Lx in the X-axis direction and the amount of positional shift Ly in the Y-axis direction. The vehicle 201 stopping inside a parking frame 54 of the parking space is photographed from the above using the camera 13 provided in the power supply device 100. As the result, a bird's-eye view image like the one illustrated in FIG. 8 can be obtained. Then, the amount of planar positional shift between the center point C2 of the power transmission coil unit 12 and the center point C1 of the power reception coil unit 22 is measured on the basis of the positional relationship between the vehicle 201 and the parking frame 54. Specifically, as illustrated in FIG. 8, the amount of positional shift Lx in the X-axis direction and the amount of positional shift Ly in the Y-axis direction can be acquired.

Figure 9:
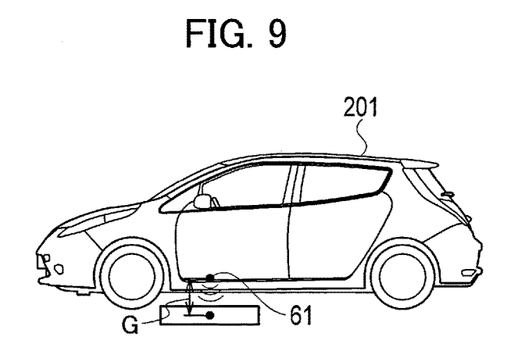
FIG. 9 is an explanatory view illustrating how the gap G is measured using a gap sensor.
Figure 10:
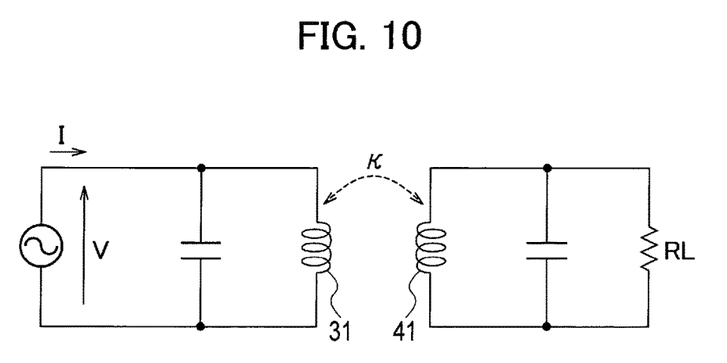
FIG. 10 is an equivalent circuit diagram of a power transmission coil unit and power reception coil unit.

Next, a method for detecting the gap G between the power transmission coil unit 12 and the power reception coil unit 22 will be explained with reference to FIG. 9 and FIG. 10. As illustrated in FIG. 9, the gap sensor 61 installed on a bottom part of the vehicle 201 can measure the gap G by transmitting an ultrasonic signal and receiving a reflected signal thereof.

Moreover, as another method, the gap G can be obtained on the basis of the coupling coefficient κ between the power transmission coil 31 and the power reception coil 41 and the respective amounts of positional shift Lx, Ly. Hereinafter, this will be explained with reference to FIG. 10 and FIG. 11. FIG. 10 is an equivalent circuit diagram of the power transmission coil unit 12 and power reception coil unit 22, in which a load RL corresponds to the battery 28 illustrated in FIG. 1. As described in Japanese Patent Laid-Open Publication No. 2013-81275, it is known that there is a relationship of Formula (4) below among a voltage V generated in the power transmission coil 31, an electric current I flowing through the power transmission coil 31, and the coupling coefficient κ between the power transmission coil 31 and the power reception coil 41.

[Math. 1]

$$\frac{I}{V} = \frac{K1 \cdot \kappa^2 + j(K2 \cdot \kappa^4 + K3 \cdot \kappa^2 + K4)}{K5 \cdot \kappa^4 + K6 \cdot \kappa^2 + K7} \qquad (4)$$

where K1 to K7 are known numerical values.

Accordingly, the coupling coefficient κ can be obtained by measuring the voltage V generated in the power transmission coil 31 and the electric current I flowing through the power transmission coil 31. This coupling coefficient κ can be acquired by the charging controller 25 through the communication between the wireless communication unit 14 and the wireless communication unit 24. That is, the charging controller 25 has a function as a coupling coefficient acquisition unit which acquires the coupling coefficient κ between the power transmission coil 31 and the power reception coil 41.

Furthermore, once the amounts of positional shift Lx, Ly in the X-axis and Y-axis directions and the coupling coefficient κ are determined, the gap G can be obtained. In the present embodiment, the gap G can be obtained by setting, in advance, a map indicating a relationship among Lx, Ly, κ and the gap G in a storage area (not illustrated) of the temperature estimation unit 33, and then applying the amounts of positional shift Lx, Ly, and κ obtained in the above-described procedure to this map.

Because the amounts of positional shift Lx, Ly, and the gap G can be obtained using the above-described method, the correction coefficient C can be obtained from the above-described Formula (2). In the present embodiment, the correction coefficient C is calculated by preparing, in advance, a correspondence map indicating a relationship among the amounts of positional shift Lx, Ly, the gap and the correction coefficient C, and substituting each numerical value into this correspondence map.

Hereinafter, the relationship among the amounts of positional shift Lx, Ly, the gap G, and the correction coefficient C will be explained with reference to a graph illustrated in FIG. 11 and an explanatory view illustrated in FIG. 12.

Figure 11:
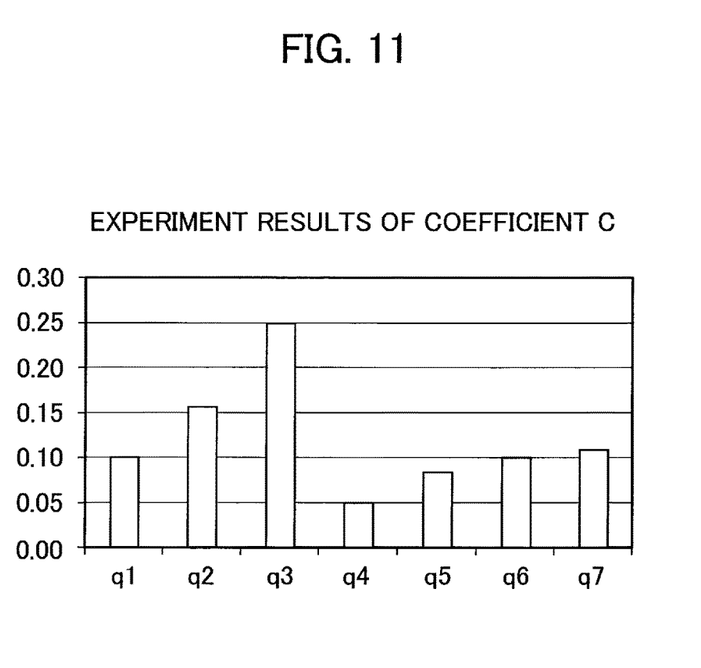
FIG. 11 is a graph illustrating a relationship between the amount of positional shift between the power transmission coil unit and the power reception coil unit and the correction coefficient C.
Figure 12:
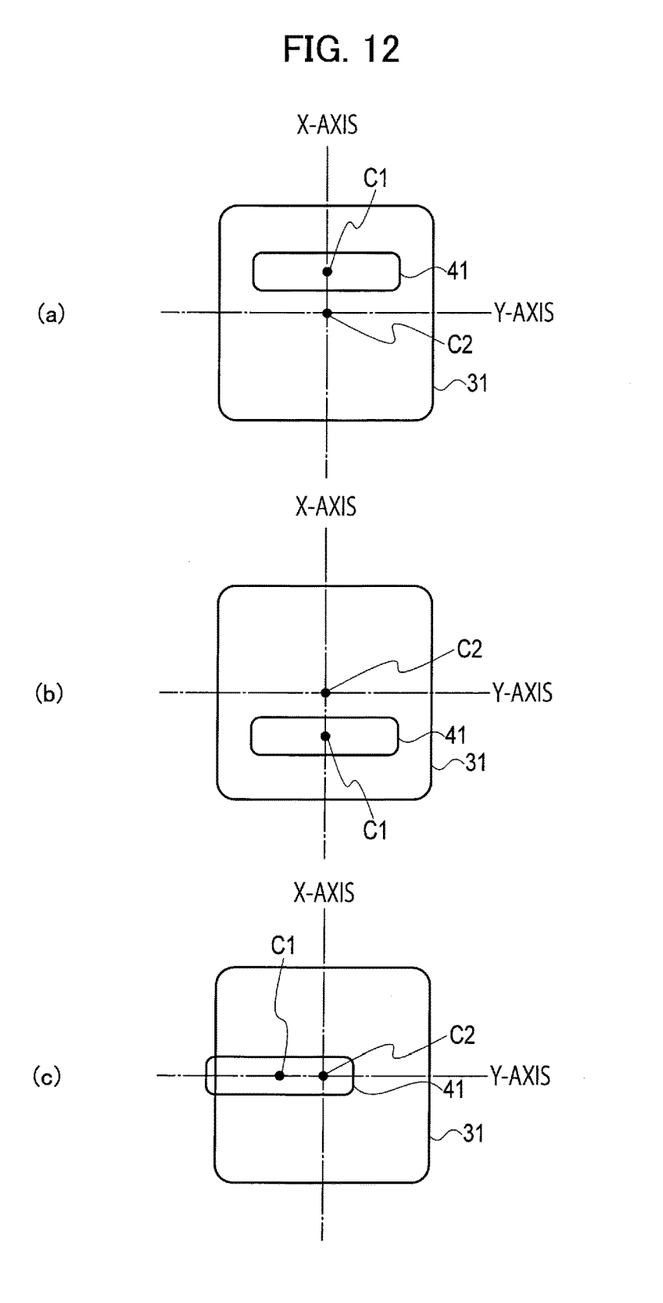
FIGS. 12(a) to 12(c) are explanatory views each illustrating the positional relationship between the power transmission coil and the power reception coil, and illustrate a case where a positional shift occurs on the plus side in the short side direction, a case where a positional shift occurs on the minus side in the short side direction, and a case where a positional shift occurs in the long side direction, respectively.

FIG. 11 is a graph illustrating a change in the correction coefficient C obtained in performing an experiment for actually changing the amounts of positional shift Lx, Ly and the gap G Reference sign q1 indicates the correction coefficient C when Lx=100 mm, Ly=0 mm, and G=100 mm. FIG. 12 is an explanatory view illustrating the relative positional relationship between the power transmission coil 31 and the power reception coil 41, in which the reference sign q1 in FIG. 11 indicates a state where the center C1 of the power reception coil 41 is shifted, by 100 mm in the plus direction of the X-axis, from the center C2 of the power transmission coil 31, as illustrated in FIG. 12(a). As indicated by the reference sign q1 of FIG. 11, the correction coefficient C is 0.10 in this case.

Similarly, reference sign q2 in FIG. 11 indicates the correction coefficient C when Lx=−100 mm, Ly=0 mm, and G=100 mm, and indicates a state where the center C1 of the power reception coil 41 is shifted, by 100 mm in the minus direction of the X-axis, from the center C2 of the power transmission coil 31, as illustrated in FIG. 12(b). As indicated by the reference sign q2 of FIG. 11, the correction coefficient C is 0.15 in this case.

Reference sign q3 in FIG. 11 indicates the correction coefficient C when Lx=0 mm, 4=100 mm and G=100 mm, and indicates a state where the center C1 of the power reception coil 41 is shifted, by 100 mm in the Y-axis direction, from the center C2 of the power transmission coil 31, as illustrated in FIG. 12(c). As indicated by the reference sign q3 of FIG. 11, the correction coefficient C is 0.25 in this case.

Furthermore, reference sign q4 in FIG. 11 indicates the correction coefficient C when Lx=0 mm, Ly=0 mm and G=150 mm, reference sign q5 indicates the correction coefficient C when Lx=100 mm, Ly=0 mm, and G=150 mm, reference sign q6 indicates the correction coefficient C when Lx=−100 mm, Ly=0 mm, and G=150 mm, and reference sign q7 indicates the correction coefficient C when Lx=0 mm, Ly=100 mm, and G=150 mm.

As described above, the correction coefficient C can be obtained by applying the amounts of positional shift Lx, Ly and the gap G to a preset correspondence map.

Furthermore, each of the coefficients a, b, and c of Formula (2) below may be obtained on the basis of the actual measurement value of the correction coefficient C. Then, the correction coefficient C may be calculated using these coefficients a, b, and c.

$$C=(a*Lx+b*Ly+c)/G^2 \qquad (2)$$

Adoption of such a calculation method enables to calculate the correction coefficient C by an extremely simple method for substituting the Lx, Ly, and G into the calculation formula.

Figure 13:
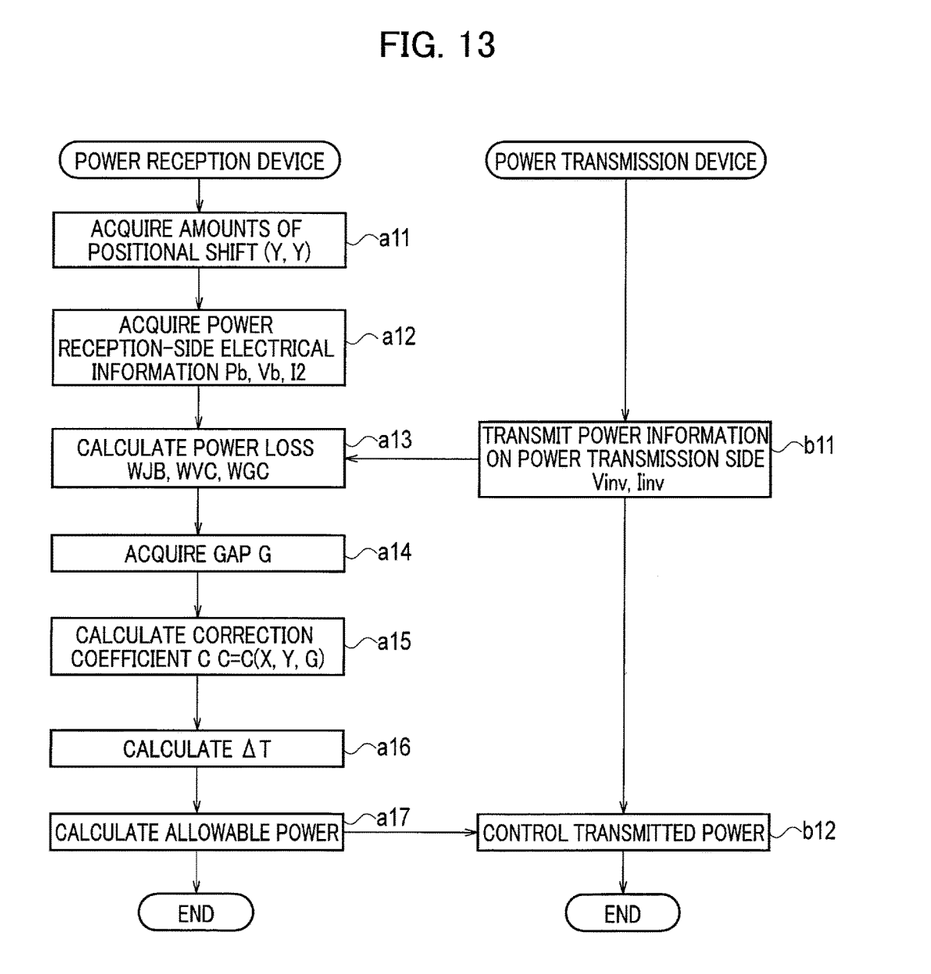
FIG. 13 is a flow chart illustrating a procedure of temperature estimation processing according to an embodiment of the present invention.

Next, the processing operation of the temperature estimation device according to the present embodiment will be explained with reference to a flow chart illustrated in FIG. 13. The flow chart in FIG. 13 illustrates the processing by the temperature estimation unit 33 illustrated in FIG. 1 and the processing by the power transmission controller 15.

First, the temperature estimation unit 33 acquires the data of the amounts of planar positional shift Lx, Ly of the power reception coil unit 22 from the power transmission coil unit 12, in Step a11. For this processing, the above-described methods illustrated in FIG. 7 and FIG. 8 can be employed.

In Step a12, the temperature estimation unit 33 acquires a received power Pb and received voltage Vb in the power reception coil unit 22, and an electric current I2 flowing through the power reception coil 41. These data can be acquired from the detection values of a voltmeter and ammeter (not illustrated) provided in the power reception coil unit 22.

In Step b11, the power transmission controller 15 measures an output voltage Vinv and output current Iinv of the inverter 113, and transmits these data to the temperature estimation unit 33 through the wireless communication unit 14 and the wireless communication unit 24.

In Step a13, the temperature estimation unit 33 calculates the respective power losses WJB, WVC, and WGC on the basis of various data. As previously described, each power loss is a copper loss and is proportional to the square of the electric current, and therefore the calculation can be conducted on the basis of this relationship.

In Step a14, the gap G between the power transmission coil unit 12 and the power reception coil unit 22 is calculated. In this processing, the gap G can be obtained by employing the above-described method illustrated in FIG. 9 and FIG. 10.

In Step a15, the temperature estimation unit 33 obtains the correction coefficient C for correcting the power loss WGC. That is, because the amounts of positional shift Lx, Ly in the plane direction are acquired in the processing of Step a11 and the gap G is acquired in the processing of Step a14, the correction coefficient C can be obtained using the above-described approach on the basis of these numerical values.

In Step a16, the temperature estimation unit 33 calculates the increase in temperature ΔT of the power reception coil unit 22 by substituting the correction coefficient C acquired in the above-described processing into Formula (1) below.

$$\Delta T = A*WJB + B*WVC + C*WGC \qquad (1)$$

In Step a17, the temperature estimation unit 33 acquires the ambient temperature Ta of the vehicle 201, and adds the increase in temperature ΔT to this ambient temperature Ta. Then, the increase in temperature ΔT is controlled so as to satisfy Formula (5) below.

$$Ta+\Delta T+Tm \leq \text{(components allowable temperature)} \qquad (5)$$

where Tm is a margin.

That is, when "Ta+ΔT+Tm" reaches a "components allowable temperature", an allowable power Px which is an allowable value of the power generated in the power reception coil unit 22 is set so that the increase in temperature ΔT is reduced. The data of this allowable power Px is transmitted to the power supply device 100 via the wireless communication unit 24 and the wireless communication unit 14.

Subsequently, in Step b12, the power transmission controller 15 controls the power transmitted by the power transmission coil unit 12 so that the power generated in the power reception coil unit 22 becomes within the allowable power Px. In this manner, the control can be conducted so that the ambient temperature of the power reception coil unit 22 does not reach the components allowable temperature.

In this manner, the temperature estimation device according to the present embodiment changes, when the positional relationship between the power transmission coil 31 provided on the ground side and the power reception coil 41 provided in the vehicle 201 is positionally shifted from a normal positional relationship, the contribution to an increase in temperature due to the power loss WGC of the power transmission coil 31, in accordance with a magnitude of this positional shift amount. Accordingly, the ambient temperature of the power reception coil unit 22 can be accurately estimated without providing a temperature sensor for measuring the ambient temperature of the power reception coil 41.

Moreover, the transmitted power by the power supply device 100 can be controlled so that the ambient temperature of the power reception coil unit 22 does not rise to a component-restrictive temperature, and an excessive increase in temperature of the power reception coil unit 22 and electronic components therearound can be prevented.

Furthermore, if the control is conducted so that the transmitted power from the power transmission coil unit 12 decreases, the charging time of the battery 28 increases. In the present embodiment, when control is conducted by the temperature estimation unit 33 so as to reduce the transmitted power, the information indicative of an increase in the charging time is displayed on the notification unit 37 to be notified to the occupant of the vehicle 201. In this manner, the occupant of the vehicle 201 can recognize in advance that the time needed for charging will increase and the occupant can have a sense of security.

Moreover, the temperature estimation unit 33 obtains the correction coefficient C on the basis of the amount of positional shift between the power transmission coil 31 and the power reception coil 41, and multiplies the power loss WGC of the power transmission coil 31 by the correction coefficient C, thereby changing the contribution to an increase in temperature due to the power loss WGC of this power transmission coil 31. Accordingly, the ambient temperature of the power reception coil unit 22 can be estimated more accurately.

Furthermore, the amounts of planar positional shift X, Y which are the amounts of positional shift between the power transmission coil 31 and the power reception coil 41, and the gap G are acquired, and the correction coefficient C is obtained on the basis of these data. Furthermore, the power loss WGC is multiplied by this correction coefficient C, and furthermore the increase in temperature ΔT is obtained from Formula (1) described above. Accordingly, the ambient temperature of the power reception coil unit 22 can be estimated more accurately.

Moreover, the coupling coefficient κ between the power transmission coil 31 and the power reception coil 41 is acquired, and the gap G is acquired on the basis of this coupling coefficient κ and the amounts of planar positional shift Lx, Ly so that it is possible to dispense with the gap sensor 61 for measuring the gap G and to reduce the device scale.

Furthermore, the coefficients a, b, and c in the above-described Formula (2) are measured, and furthermore the amounts of positional shift Lx, Ly and the gap G are substituted into Formula (2) to obtain the correction coefficient C, so that the correction coefficient C can be accurately obtained and accordingly the increase in temperature ΔT can be accurately estimated.

In the foregoing, the temperature estimation device and temperature estimation method for the contactless power reception device of the present invention have been explained on the basis of the illustrated embodiment, but the present invention is not limited thereto. The configuration of each unit can be replaced with any configuration having a similar function.

REFERENCE SIGNS LIST 11 power controller
12 power transmission coil unit
13 camera
14 wireless communication unit
15 power transmission controller
22 power reception coil unit
24 wireless communication unit
25 charging controller
26 rectifier
27 relay
28 battery
29 inverter
30 motor
31 power transmission coil
33 temperature estimation unit
35 ferrite plate
37 notification unit
41 power reception coil
42 ferrite plate
43 circuit board
44 circuit board
45 electric box
51 forward-distance sensor
52 wall surface
54 parking frame
61 gap sensor
100 power supply device
101 contactless power supply system
111 rectifier
112 PFC circuit
113 inverter
200 power reception device
201 vehicle
300 AC power supply

The invention claimed is:

1. A temperature estimation device for estimating an ambient temperature of a power reception coil which contactlessly receives a power transmitted from a power transmission coil, the temperature estimation device comprising:
a power transmission-side power loss acquisition unit which acquires a power loss of the power transmission coil;
a positional shift amount acquisition unit which acquires a gap between the power transmission coil and the power reception coil and a planar positional shift amount between the power transmission coil and the power reception coil, and determines a correction coefficient on a basis of the gap and the planar positional shift amount; and a temperature estimation unit which estimates the ambient temperature of the power reception coil on a basis of a preset amount of heat generation of the power reception device and the power loss of the power transmission coil, wherein when a positional relationship between the power transmission coil and the power reception coil is shifted from a normal positional relationship, the temperature estimation unit changes, a magnitude of influence of the power loss to a rising amount of the estimated ambient temperature, by multiplying the power loss of the power transmission coil by the correction coefficient.

2. The temperature estimation device according to claim 1, further comprising:

a coupling coefficient acquisition unit which acquires a coupling coefficient between the power transmission coil and the power reception coil, wherein the positional shift amount acquisition unit acquires the gap on a basis of the planar positional shift amount and the coupling coefficient.

3. The temperature estimation device according to claim 1, wherein the positional shift amount acquisition unit acquires a positional shift amount in an X-axis direction and a positional shift amount in a Y-axis direction perpendicular to the X-axis, as the planar positional shift amount, and further calculates the correction coefficient by a formula: $C=(a*Lx+b*Ly+c)/G^2$ where a, b, and c are coefficients, G is the gap between the power transmission coil and the power reception coil, and Lx, Ly are the positional shift amount in the X-axis direction and the positional shift amount in the Y-axis direction, respectively.

4. A temperature estimation method for estimating an ambient temperature of a power reception coil which contactlessly receives a power transmitted from a power transmission coil, the temperature estimation method comprising the steps of:

acquiring a power loss of the power transmission coil;
acquiring
a gap between the power transmission coil and the power reception coil and
a planar positional shift amount between the power transmission coil and the power reception coil, and
determining a correction coefficient on a basis of the gap and the planar positional shift amount;

estimating the ambient temperature of the power reception coil on a basis of a preset amount of heat generation of the power reception device and the power loss of the power transmission coil; and changing a magnitude of influence of the power loss to a rising amount of the estimated ambient temperature by multiplying the power loss of the power transmission coil by the correction coefficient, in a case where a positional relationship between the power transmission coil and the power reception coil is shifted from a normal positional relationship.

* * * * *